(12) United States Patent
Lee et al.

(10) Patent No.: US 7,238,972 B2
(45) Date of Patent: Jul. 3, 2007

(54) PHOTODETECTOR

(75) Inventors: Ming-Lum Lee, Tainan County (TW); Wei-Chih Lai, Tainan County (TW); Shih-Chang Shei, Tainan County (TW)

(73) Assignee: Epitech Technology Corporation, Tainan County (TW)

( * ) Notice: Subject to any disclaimer, the term of this patent is extended or adjusted under 35 U.S.C. 154(b) by 221 days.

(21) Appl. No.: 11/129,787

(22) Filed: May 16, 2005

(65) Prior Publication Data

US 2006/0226417 A1    Oct. 12, 2006

(30) Foreign Application Priority Data

Apr. 8, 2005    (TW)    ................ 94111235 A

(51) Int. Cl.
*H01L 31/0328* (2006.01)
*H01L 31/0336* (2006.01)
*H01L 31/072* (2006.01)
*H01L 31/109* (2006.01)
*H01L 29/732* (2006.01)

(52) U.S. Cl. ............... 257/189; 257/21; 257/184; 257/185; 257/186; 257/201

(58) Field of Classification Search ............ 257/21, 257/184–186, 189, 201
See application file for complete search history.

(56) References Cited

U.S. PATENT DOCUMENTS

| | | | | |
|---|---|---|---|---|
| 5,329,136 A * | 7/1994 | Goossen | ............... | 257/17 |
| 5,557,117 A * | 9/1996 | Matsuoka et al. | .......... | 257/184 |
| 5,625,202 A * | 4/1997 | Chai | ............... | 257/94 |
| 5,668,388 A * | 9/1997 | Delage et al. | ............ | 257/197 |
| 5,889,296 A * | 3/1999 | Imamura et al. | ............ | 257/184 |
| 6,806,512 B2 * | 10/2004 | Nguyen et al. | ............ | 257/197 |
| 6,822,274 B2 * | 11/2004 | Yi et al. | ............ | 257/189 |
| 6,909,161 B2 * | 6/2005 | Ishibashi et al. | ............ | 257/458 |
| 6,936,871 B2 * | 8/2005 | Hase | ............... | 257/198 |
| 2001/0042860 A1 * | 11/2001 | Hata et al. | ............ | 257/21 |
| 2002/0050592 A1 * | 5/2002 | Kakinuma | ............ | 257/53 |
| 2006/0163681 A1 * | 7/2006 | Wu et al. | ............ | 257/431 |

* cited by examiner

*Primary Examiner*—Ida M. Soward
(74) *Attorney, Agent, or Firm*—Thomas, Kayden, Horstemeyer & Risley

(57) ABSTRACT

A photodetector is described. The photodetector is comprised of a substrate, a first n-type III-V compound semiconductor layer located on the substrate, an $n^{++}$-type III-V compound semiconductor layer located on a first portion of the first n-type III-V compound semiconductor layer with a second portion of the first n-type III-V compound semiconductor layer exposed, a p-type III-V compound semiconductor layer located on the $n^{++}$-type compound semiconductor layer, an undoped III-V compound semiconductor layer located on the p-type III-V compound semiconductor layer, a second n-type III-V compound semiconductor layer located on the undoped III-V compound semiconductor layer, a conductive transparent oxide layer located on the second n-type III-V compound semiconductor layer, a first electrode located on a portion of the conductive transparent oxide layer, and a second electrode located on a portion of the second portion of the first n-type III-V compound semiconductor layer.

31 Claims, 2 Drawing Sheets

PHOTODETECTOR

RELATED APPLICATIONS

The present application is based on, and claims priority from, Taiwan Application Ser. No. 94111235, filed Apr. 8, 2005, the disclosure of which is hereby incorporated by reference herein in its entirety.

FIELD OF THE INVENTION

The present invention relates to a photodetector, and more particularly, to a photodetector composed of a III-V compound semiconductor.

BACKGROUND OF THE INVENTION

In general, in the application of an ultraviolet photodetector, while light is incident on to a p-type semiconductor layer, an undoped absorption layer and an n-type semiconductor layer of the photodetector, by means of particular bandgaps of these layers, incident photons with energy larger than the bandgap of the undoped absorption layer are absorbed by the undoped absorption layer, so that electron-hole pairs are induced within the absorption layer. Now, after a voltage is applied to the photodetector, these electron-hole pairs are driven and generate current. Therefore, an incident light can be detected by using the aforementioned theorem.

FIG. 1 is a cross-sectional view of a conventional photodetector. The photodetector constructed on the substrate 100, which is composed of sapphire, comprises the substrate 100, a nucleation layer 102, an n-type buffer layer 104, an undoped absorption layer 106, a p-type contact layer 108, a semi-transparent metal layer 110, a p-type electrode 112 and an n-type electrode 114. In the photodetector structure, the nucleation layer 102 is located on the substrate 100, the n-type buffer layer 104 is located on the nucleation layer 102, the undoped absorption layer 106 is located on a portion of the n-type buffer layer 104, the p-type contact layer 108 is located on the undoped absorption layer 106, the semi-transparent metal layer 110 is located on the p-type contact layer 108, the p-type electrode 112 is located on a portion of the semi-transparent metal layer 110 and the n-type electrode 114 is located on a portion of the n-type buffer layer 104 which is not covered by the undoped absorption layer 106. Typically, the nucleation layer 102 is composed of $Al_xIn_yGa_{1-x-y}N$, the n-type buffer layer 104 is composed of $Al_xIn_yGa_{1-x-y}N$, the undoped absorption layer 106 is composed of $Al_xIn_yGa_{1-x-y}N$, the p-type contact layer 108 is composed of p-type doped $Al_xIn_yGa_{1-x-y}N$, the semi-transparency metal layer 110 is composed of a Ni/Au stacked structure, the p-type electrode 112 is composed of a Ti/Au stacked structure and the n-type electrode 114 is composed of a Ti/Al/Ti/Au stacked structure.

When the photodetector is used to detect the incident light 116, the incident light 116 penetrates the photodetector from the p-type contact layer 108 toward the undoped absorption layer 106 and the n-type buffer layer 104. The aluminum content of the p-type contact layer 108 needs to be enhanced to increase the bandgap of the p-type contact layer 108 for the photodetector used to detect ultraviolet of high energy. However, the increase of the aluminum content in the p-type contact layer 108 reduces the conductivity of the p-type contact layer 108 and the activation efficiency of the p-type dopants, so that it is difficult to form the p-type contact layer 108 with high carrier concentration, resulting in high-resistivity p-type electrode contact 110. The semi-transparent metal layer 110 needs to be formed on a material layer with low resistivity, i.e. high hole concentration. Accordingly, while the p-type contact layer 108 has higher resistivity, the semi-transparent metal layer 110 does not have a good ohmic contact with the p-type contact layer 108, thereby degrading the performance of the photodetector. Furthermore, a portion of the electric field may be across the p-type contact layer 108 resulting from the higher resistivity of the p-type contact layer 108, thereby reducing the detecting performance of the device.

Presently, in order to solve the problem of the poor doping efficiency of the p-type semiconductor layer in the aforementioned photodetector, another photodetector is provided, such as that illustrated in FIG. 2. In the fabrication of the photodetector, a nucleation layer 202 is formed on a substrate 200, and an n-type buffer layer 204 is formed on the nucleation layer 202. Next, an undoped absorption layer 206 is formed on the n-type buffer layer 204, and a p-type contact layer 208 is formed on the undoped absorption layer 206. Then, a portion of the p-type contact layer 208 and a portion of the undoped absorption layer 206 are removed by a photolithography and etching method until a portion of the n-type buffer layer 204 is exposed. A semi-transparent metal layer 210 is formed on the p-type contact layer 208. Subsequently, a p-type electrode 212 is formed on a portion of the semi-transparent metal layer 210, and the n-type electrode 214 is formed on a portion of the exposed portion of the n-type buffer layer 204. Then, the substrate and the epitaxial layers formed thereon are inversed by a flip-chip configuration. The substrate 200 is composed of sapphire, the nucleation layer 202 is composed of $Al_xIn_yGa_{1-x-y}N$, the n-type buffer layer 204 is composed of n-type doped $Al_xIn_yGa_{1-x-y}N$, the undoped absorption layer 206 is composed of undoped $Al_xIn_yGa_{1-x-y}N$, the p-type contact layer 208 is composed of p-type doped $Al_aIn_bGa_{1-a-b}N$ ($x > a \geq 0$; $y \geq 0$; $b \geq 0$), the semi-transparent metal layer 210 is composed of a Ni/Au stacked structure, and the p-type electrode 212 and the n-type electrode 214 are both composed of a Ti/Al/Ti/Au stacked structure.

When the photodetector is used to detect the incident light 216, the incident light 216 penetrates the photodetector from the substrate 200 toward the nucleation layer 202, the n-type buffer layer 204 and the undoped absorption layer 206. The n-type contact layer 204 has higher aluminum content, and it is very easy to obtain the n-type buffer layer 204 with high carrier concentration, i.e. with low resistivity, so the n-type buffer layer 204 can achieve good ohmic contact with the n-type electrode 214 formed thereon. Additionally, the incident light 216 is transmitted from the n-type buffer layer 204 to the undoped absorption layer 206, and the bandgap of the p-type contact layer 208 does not have to be higher than that of the undoped absorption layer 206, so the aluminum content of the p-type contact layer 208 does not need to be too high, and it is easy to form the p-type contact layer 208 having a low ohmic contact with the semi-transparent metal layer 210 (the semi-transparent metal layer 210 can be made of a Ni/Au stacked structure).

However, in the fabrication, after the various layers of the photodetector are formed, a flip-chip step has to be performed to inverse the substrate 200 and the layers formed thereon, so as to put the n-type buffer layer 204 above the undoped absorption layer 206, such that the incident light 216 enters the undoped absorption layer 206 from the n-type buffer layer 204 for detecting the incident light 216. Such a flip-chip step complicates the process, reducing the process yield.

SUMMARY OF THE INVENTION

Therefore, one objective of the present invention is to provide a photodetector. The photodetector has a strained layer superlattice (SLS) structure composed of III-V compound semiconductors, and the strained layer superlattice structure can have a high carrier concentration, so that the resistivity of the strained layer superlattice structure can be lowered to enhance the performance of the photodetector.

Another objective of the present invention is to provide a photodetector having a strained layer superlattice structure. The strained layer superlattice structure can have low-resistivity ohmic contact with the conductive layer or the electrode subsequently formed on the surface of the strained layer superlattice structure, so that the two electrodes of the photodetector can be made of the same material, thereby simplifying the process and enhancing the process yield.

Still another objective of the present invention is to provide a photodetector having an $n^{++}$-type tunneling layer of high carrier concentration under the n-i-p diode structure, so that a tunneling junction can be formed to keep the n-i-p diode structure electrically conducting. Electrodes of the photodetector are formed on a conductive transparent layer and an n-type compound semiconductor layer under the $n^{++}$-type tunneling layer, so the electrodes can have low-resistivity ohmic contact with the conductive transparent layer and the n-type compound semiconductor layer, thereby greatly enhancing the performance of the device. Furthermore, the two electrodes can be made of the same material, so the process complexity can be lowered to correspondingly enhance the process yield.

According to the aforementioned objectives, the present invention provides a photodetector comprising: a substrate; an n-type III-V compound semiconductor layer located on the substrate; an undoped III-V compound semiconductor layer located on a first portion of the n-type III-V compound semiconductor layer with a second portion of the n-type III-V compound semiconductor layer exposed; a p-type III-V compound semiconductor layer located on the undoped III-V compound semiconductor layer a strained layer superlattice structure located on the p-type III-V compound semiconductor layer; a conductive layer located on the strained layer superlattice structure; a p-type electrode located on a portion of the conductive layer; and an n-type electrode located on a portion of the second portion of the n-type III-V compound semiconductor layer.

According to a preferred embodiment of the present invention, a material of the undoped III-V compound semiconductor layer can be GaN, $Al_qGa_{1-q}N$, $Al_xIn_yGa_{1-x-y}N$, $Al_sIn_tGa_{1-s-t}P$, $Al_zGa_{1-z}As$ or $In_pGa_{1-p}As$. Additionally, the strained layer superlattice structure can be $Al_kGa_{1-k}N/Al_oGa_{1-o}N$ (k>o>q≧0), $Al_aIn_bGa_{1-a-b}N/Al_cIn_dGa_{1-c-d}N$ (a>c>x≧0; b≧0; c≧0), $Al_eIn_fGa_{1-e-f}P/Al_gIn_hGa_{1-g-h}P$ (e>g>s≧0; f≧0; h≧0), $Al_iGa_{1-i}As/Al_jGa_{1-j}As$ (i>j>z≧0) or $In_mGa_{1-m}As/In_nGa_{1-n}As$ (m>n>p≧0).

According to the aforementioned objectives, the present invention further provides a photodetector comprising: a substrate; a first n-type III-V compound semiconductor layer located on the substrate; an $n^{++}$-type III-V compound semiconductor layer located on a first portion of the first n-type III-V compound semiconductor layer with a second portion of the first n-type III-V compound semiconductor layer exposed; a p-type III-V compound semiconductor layer located on the $n^{++}$-type compound semiconductor layer; an undoped III-V compound semiconductor layer located on the p-type III-V compound semiconductor layer; a second n-type III-V compound semiconductor layer located on the undoped III-V compound semiconductor layer; a conductive transparent oxide layer located on the second n-type III-V compound semiconductor layer; a first electrode located on a portion of the conductive transparent oxide layer; and a second electrode located on a portion of the second portion of the first n-type III-V compound semiconductor layer.

According to a preferred embodiment of the present invention, the $n^{++}$-type compound semiconductor layer is a tunneling layer, and a material of the $n^{++}$-type III-V compound semiconductor layer can be GaN, $Al_aGa_{1-a}N$, $Al_cIn_dGa_{1-c-d}N$, $Al_gIn_hGa_{1-g-h}P$, $Al_kGa_{1-k}As$ or $In_oGa_{1-o}As$. In another embodiment, the $n^{++}$-type compound semiconductor layer is a strained layer superlattice structure, and the structure of the $n^{++}$-type III-V compound semiconductor layer can be $Al_aGa_{1-a}N/Al_bGa_{1-b}N$ (a>b≧0), $Al_cIn_dGa_{1-c-d}N/Al_eIn_fGa_{1-e-f}N$ (c>e≧0; d≧0; f≧0), $Al_gIn_hGa_{1-g-h}P/Al_iIn_jGa_{1-i-j}P$ (g>i≧0; h≧0; j≧0), $Al_kGa_{1-k}As/Al_mGa_{1-m}As$ (k>m≧0), or $In_oGa_{1-o}As/In_pGa_{1-p}As$ (o>p≧0).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a photodetector mainly composed of III-V compound semiconductor materials, and the photodetector has excellent performance. Further, the photodetector can be used to detect light sources of different wavelengths by adjusting the composition of the compound semiconductor materials, so the photodetector has wide applicability. In order to make the illustration of the present invention more explicit and complete, the following description is stated with reference to FIGS. 3 and 4.

Figure 1:
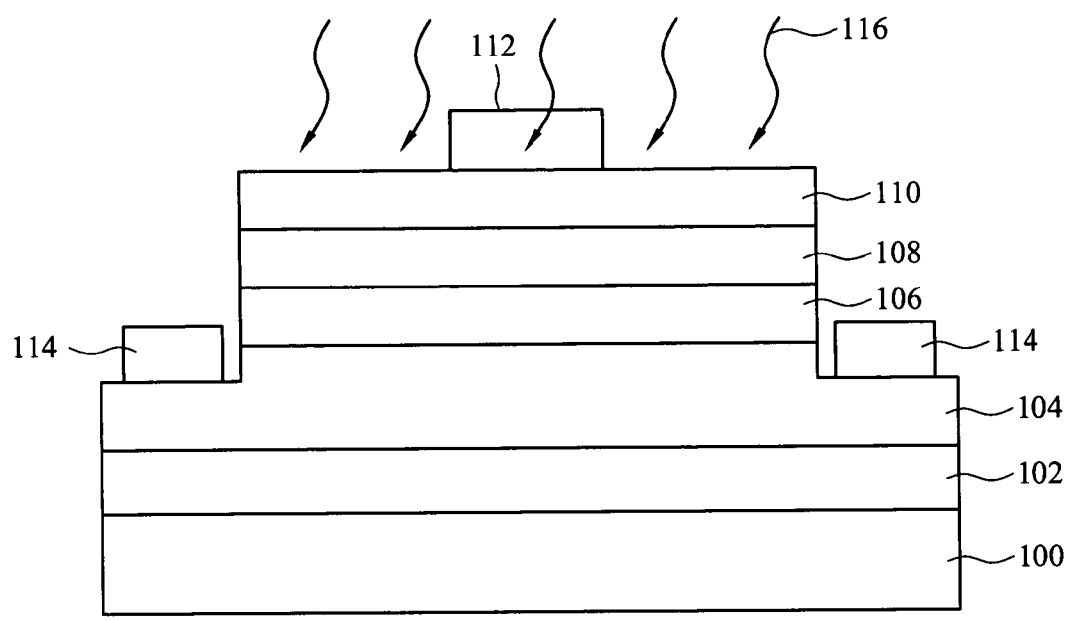
FIG. 1 is a cross-sectional view of a conventional ultraviolet photodetector.
Figure 2:
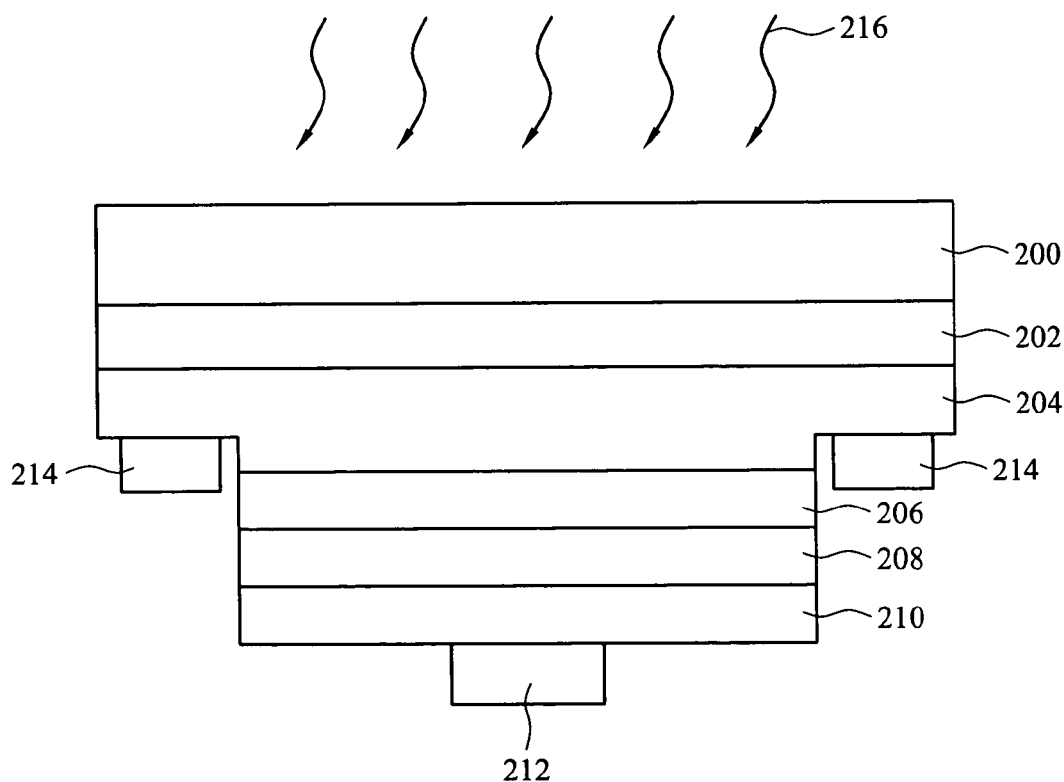
FIG. 2 is a cross-sectional view of another conventional photodetector.
Figure 3:
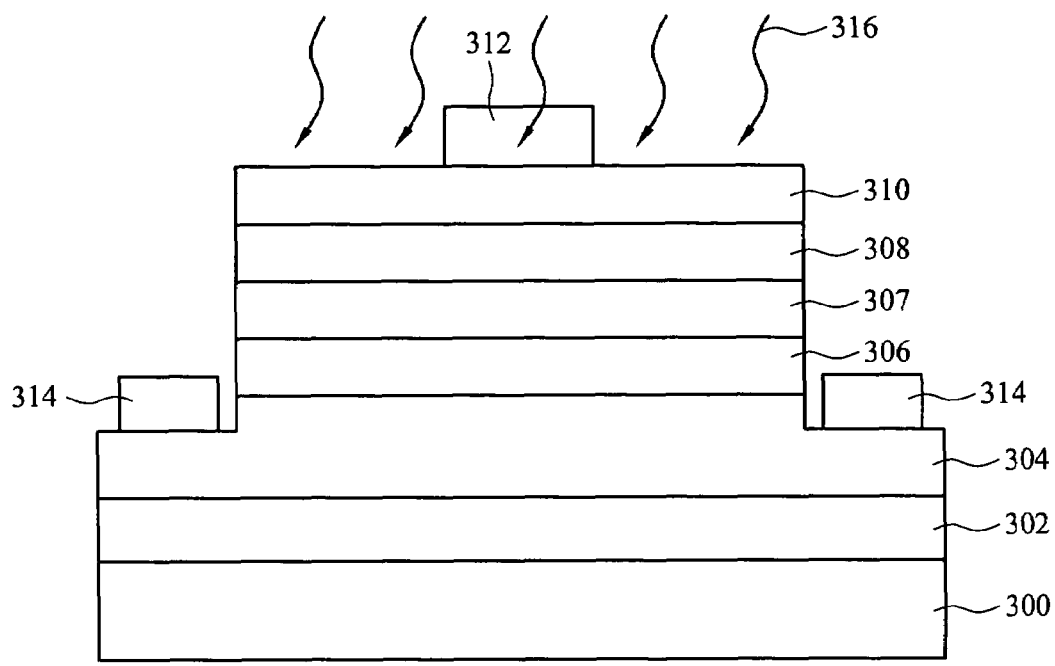
FIG. 3 is a cross-sectional view of a photodetector in accordance with a preferred embodiment of the present invention.

FIG. 3 is a cross-sectional view of a photodetector in accordance with a preferred embodiment of the present invention. The photodetector is mainly composed of a substrate 300, an n-type III-V compound semiconductor layer 304, an undoped III-V compound semiconductor layer 306, a p-type III-V compound semiconductor layer 307, a strained layer superlattice structure 308, a transparent conductive layer 310, a p-type electrode 312 and an n-type electrode 314. The n-type III-V compound semiconductor layer 304 is located on the substrate 300, and in order to successively grow the n-type III-V compound semiconductor layer 304 on the substrate 300, a nucleation layer 302 is formed between the substrate 300 and the n-type III-V compound semiconductor layer 304. A material of the substrate 300 can be, for example, sapphire ($Al_2O_3$), GaAs, Si, SiC or ZnO. A material of the nucleation layer 302 is a III-V compound semiconductor, such as GaN, AlGaN, AlInGaN, AlInGaP, AlGaAs or InGaAs. The n-type III-V compound semiconductor layer 304 is an n-type buffer layer, which can be composed of, for example, n-type doped GaN, AlGaN, AlInGaN, AlInGaP, AlGaAs or InGaAs, and the n-type dopant can be, for example, silicon.

According to the process, the n-type III-V compound semiconductor layer 304 typically has a mesa structure. The undoped III-V compound semiconductor layer 306 is located on the mesa structure of the n-type III-V compound semiconductor layer 304, and the other portion of the n-type III-V compound semiconductor layer 304 is exposed, such as shown in FIG. 3. The undoped III-V compound semiconductor layer 306 is used as an absorption layer, which can be composed of GaN, $Al_qGa_{1-q}N$, $Al_xIn_yGa_{1-x-y}N$, $Al_s-In_tGa_{1-s-t}P$, $Al_zGa_{1-z}As$ or $In_pGa_{1-p}As$. The p-type III-V compound semiconductor layer 307 can be composed of GaN, $Al_qGa_{1-q}N$, $Al_xIn_yGa_{1-x-y}N$, $Al_sIn_tGa_{1-s-t}P$, $Al_zGa_{1-z}As$ or $In_pGa_{1-p}As$. The strained layer superlattice structure 308 is located on the p-type III-V compound semiconductor layer 307, in which the strained layer superlattice structure 308 is used as a contact layer, and the bandgap of the material of the strained layer superlattice structure 308 is larger than that of the undoped III-V compound semiconductor layer 306. The strained layer superlattice structure 308 can be composed of III-V compound semiconductor stacked material layers including p-type or n-type doped $Al_kGa_{1-k}N/Al_oGa_{1-o}N$ (k>o>q≧0), $Al_aIn_bGa_{1-a-b}N/Al_cIn_dGa_{1-c-d}N$ (a>c>x≧0; b≧0; c≧0), $Al_eIn_fGa_{1-e-f}P/Al_gIn_hGa_{1-g-h}P$ (e>g>s≧0; f≧0; h≧0), $Al_iGa_{1-i}As/Al_jGa_{1-j}As$ (i>j>z≧0) or $In_mGa_{1-m}As/In_nGa_{1-n}As$ (m>n>p≧0). The p-type dopant can be Mg, and the n-type dopant can be Si, for example.

It is difficult to form a p-type III-V compound semiconductor with high hole concentration by using p-type dopants to dope a single layer of p-type III-V compound semiconductor material. Therefore, one feature of the present invention is to use the strained layer superlattice structure 308 as a p-type contact layer of the photodetector, the strained layer superlattice structure 308 can be formed with high doping concentration, thereby greatly reducing the resistivity of the strained layer superlattice structure 308. Further, because the resistivity of the strained layer superlattice structure 308 is decreased, the electric field across the strained layer superlattice structure 308 can be reduced, thereby increasing the performance of the photodetector.

Then, the transparent conductive layer 310 is formed on the strained layer superlattice structure 308, and the transparent conductive layer 310 can be, for example, a semi-transparent metal layer or a conductive transparent oxide layer, in which the semi-transparent metal layer can be composed of, for example, a Ni/Au structure. The thickness of the transparent conductive layer 310 composed of the conductive transparent oxide layer is equal to $(2m-1)\lambda/4n$, in which m is an integer, n is the refractive index of the conductive layer 310, and λ is the cut-off wavelength of the photodetector. The p-type electrode is located on a portion of the transparent conductive layer 310, and the n-type electrode 314 is located on a portion of the exposed portion of the n-type III-V compound semiconductor layer 304, in which the p-type electrode and the n-type electrode can be composed of Cr/Au or Cr/Pt/Au, for example.

Another feature of the present invention is that because the strained layer superlattice structure 308 has high carrier concentration and low resistivity, the strained layer superlattice structure 308 can have very good ohmic contact with the transparent conductive layer 310, and the material selectivity of the transparent conductive layer 310 can be greatly increased. Additionally, for the convenience of the manufacturing process, the p-type electrode 312 and the n-type electrode 314 can be made of the same material, so that the p-type electrode 312 and the n-type electrode 314 can be formed in the same process.

When the photodetector is used to detect the incident light 316, the incident light 316 penetrates the photodetector from the strained layer superlattice structure 308 and the p-type III-V compound semiconductor layer 307 toward the undoped III-V compound semiconductor layer 306 and the n-type III-V compound semiconductor layer 304. Because the transparent conductive layer 310 has excellent ohmic contact with the strained layer superlattice structure 308, the photodetector has superior performance.

In the present embodiment, by selecting the III-V compound semiconductor materials and adjusting the ratio of the element compositions in the III-V compound semiconductor materials, the bandgap of the strained layer superlattice structure 308 and the p-type III-V compound semiconductor layer 307 can be larger than that of the undoped III-V compound semiconductor layer 306, so that the photodetector of the present invention can be used as a visible light photodetector, an ultraviolet photodetector, or an infrared photodetector. For example, when the III-V compound semiconductor material is selected from the AlGaN group, the aluminum content of AlGaN forming the strained layer superlattice structure 308 is larger than that of AlGaN forming the undoped III-V compound semiconductor layer 306; when the III-V compound semiconductor material is selected from the AlInGaN group, the aluminum content of AlInGaN forming the strained layer superlattice structure 308 is larger than that of AlInGaN forming the undoped III-V compound semiconductor layer 306; when the III-V compound semiconductor material is selected from the AlInGaP group, the aluminum content of AlInGaP forming the strained layer superlattice structure 308 is larger than that of AlInGaP forming the undoped III-V compound semiconductor layer 306; when the III-V compound semiconductor material is selected from the AlGaAs group, the aluminum content of AlGaAs forming the strained layer superlattice structure 308 is larger than that of AlGaAs forming the undoped III-V compound semiconductor layer 306; and when the III-V compound semiconductor material is selected from the InGaAs group, the indium content of InGaAs forming the strained layer superlattice structure 308 is less than that of InGaAs forming the undoped III-V compound semiconductor layer 306. Certainly, a strained layer made of a single film with high doping concentration (i.e. low resistivity) also can be used to replace the strained layer superlattice structure described above according to the same principle.

Figure 4:
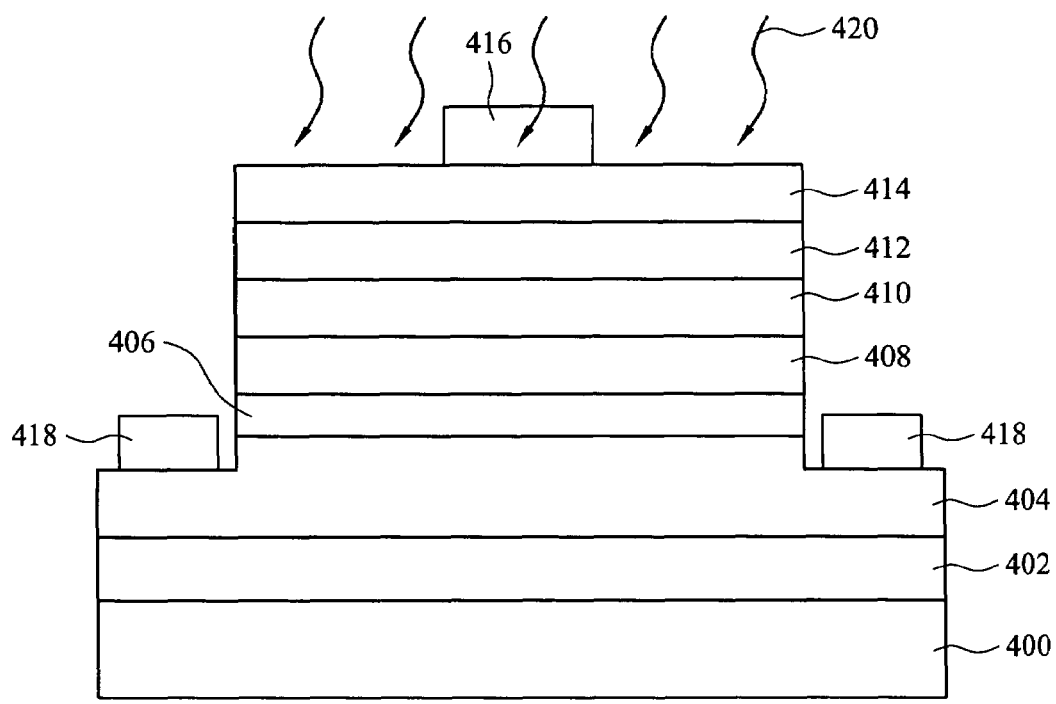
FIG. 4 is a cross-sectional view of a photodetector in accordance with another preferred embodiment of the present invention.

FIG. 4 is a cross-sectional view of a photodetector in accordance with another preferred embodiment of the present invention. The photodetector is mainly composed of a substrate 400, an n-type III-V compound semiconductor layer 404, an $n^{++}$-type III-V compound semiconductor layer 406, a p-type III-V compound semiconductor layer 408, an undoped III-V compound semiconductor layer 410, an n-type III-V compound semiconductor layer 412, an electrode 416 and an electrode 418. The n-type III-V compound semiconductor layer 404 is located on the substrate 400, and a nucleation layer 402 can be formed between the substrate 400 and the n-type III-V compound semiconductor layer 404 to successively grow the n-type III-V compound semiconductor layer 404. A material of the substrate 400 can be, for example, sapphire, GaAs, Si, SiC or ZnO. A material of the nucleation layer 402 is a III-V compound semiconductor, such as GaN, $Al_xGa_{1-x}N$, $Al_xIn_yGa_{1-x-y}N$, $Al_xIn_yGa_{1-x-y}P$, $Al_xGa_{1-x}As$ or $In_xGa_{1-x}As$ ($1 \geq x \geq 0$; $1 \geq y \geq 0$). The n-type III-V compound semiconductor layer 404 is an n-type conductive buffer layer, which can be composed of, for example, n-type doped GaN, $Al_xGa_{1-x}N$, $Al_xIn_yGa_{1-x-y}N$, $Al_xIn_yGa_{1-x-y}P$, $Al_xGa_{1-x}As$ or $In_xGa_{1-x}As$ ($1 \geq x \geq 0$; $1 \geq y \geq 0$), and the n-type dopant can be, for example, silicon. In the present invention, the n-type III-V compound semiconductor layer 404 can be composed of a semiconductor material with spatially uniform doping concentration and is preferably composed of an n-type heavily doped material for the enhancement of the conductivity.

According to the process, the n-type III-V compound semiconductor layer 404 typically has a mesa structure. The $n^{++}$-type III-V compound semiconductor layer 406 is located on the mesa structure of the n-type III-V compound semiconductor layer 404, and the other portion of the n-type III-V compound semiconductor layer 404 is exposed, such as that shown in FIG. 4. The $n^{++}$-type III-V compound semiconductor layer 406 is used as a tunneling layer, in which a doping concentration of the $n^{++}$-type III-V compound semiconductor layer 406 is preferably $>10^{19}/cm^3$, and the n-type dopant can be silicon, for example. The $n^{++}$-type III-V compound semiconductor layer 406 can be composed of a single layer of III-V compound semiconductor material or a strained layer superlattice structure. The single layer of III-V compound semiconductor material forming the $n^{++}$-type III-V compound semiconductor layer 406 can be, for example, GaN, $Al_aGa_{1-a}N$, $Al_cIn_dGa_{1-c-d}N$, $Al_gIn_hGa_{1-g-h}P$, $Al_kGa_{1-k}As$ or $In_oGa_{1-o}As$. Besides, the strained layer superlattice structure forming the $n^{++}$-type III-V compound semiconductor layer 406 can be, for example, $Al_aGa_{1-a}N/Al_bGa_{1-b}N$ ($a>b \geq 0$), $Al_cIn_dGa_{1-c-d}N/Al_eIn_fGa_{1-e-f}N$ ($c>e \geq 0$; $d \geq 0$; $f \geq 0$), $Al_gIn_hGa_{1-g-h}P/Al_iIn_jGa_{1-i-j}P$ ($g>i \geq 0$; $h \geq 0$; $j \geq 0$), $Al_kGa_{1-k}As/Al_mGa_{1-m}As$ ($k>m \geq 0$), or $In_oGa_{1-o}As/In_pGa_{1-p}As$ ($o>p \geq 0$).

The p-type III-V compound semiconductor layer 408 is located on the $n^{++}$-type III-V compound semiconductor layer 406, in which the p-type III-V compound semiconductor layer 408 is used as a p-type cladding layer. A material of the p-type III-V compound semiconductor layer 408 can be, for example, GaN, AlGaN, AlInGaN, AlInGaP, AlGaAs or InGaAs, and the p-type dopant can be, for example, Mg. The undoped III-V compound semiconductor layer 410 used as an absorption layer is located on the p-type III-V compound semiconductor layer 408, in which a material of the undoped III-V compound semiconductor layer 410 is preferably $Al_aGa_{1-a}N$, $Al_bIn_cGa_{1-b-c}N$, $Al_dIn_eGa_{1-d-e}P$, $Al_fGa_{1-f}As$, or $In_gGa_{1-g}As$. The III-V compound semiconductor layer 412 is located on the undoped III-V compound semiconductor layer 410, in which the n-type III-V compound semiconductor layer 412 is a contact layer, a doping concentration of the n-type III-V compound semiconductor layer 412 is preferably $>10^{18}/cm^3$, and the n-type dopant can be silicon, for example. The n-type III-V compound semiconductor layer 412 can be composed of a single layer of III-V compound semiconductor material or a strained layer superlattice structure. When the n-type III-V compound semiconductor layer 412 is composed of a single layer of III-V compound semiconductor material, the material of the n-type III-V compound semiconductor layer 412 can be, for example, $Al_hGa_{1-h}N$ ($h>a \geq 0$), $Al_iIn_jGa_{1-i-j}N$ ($i>b \geq 0$; $j \geq 0$), $Al_kIn_mGa_{1-k-m}P$ ($k>d \geq 0$; $m \geq 0$), $Al_nGa_{1-n}As$ ($n>f \geq 0$), or $In_oGa_{1-o}As$ ($o>g \geq 0$). Besides, when the n-type III-V compound semiconductor layer 412 is composed of a strained layer superlattice structure, the material of the n-type III-V compound semiconductor layer 412 can be, for example, $Al_hGa_{1-h}N/Al_pGa_{1-p}N$ ($h>p>a \geq 0$), $Al_iIn_jGa_{1-i-j}N/Al_qIn_rGa_{1-q-r}N$ ($i>q>b \geq 0$; $j \geq 0$; $r \geq 0$), $Al_kIn_mGa_{1-k-m}P/Al_sIn_tGa_{1-s-t}P$ ($k>s>d \geq 0$; $m \geq 0$; $t \geq 0$), $Al_nGa_{1-n}As/Al_uGa_{1-u}As$ ($n>u>f \geq 0$), or $In_oGa_{1-o}As/In_vGa_{1-v}As$ ($o>v>g \geq 0$). The bandgap of the n-type III-V compound semiconductor layer 412 is larger than that of the undoped III-V compound semiconductor layer 410.

By adjusting the aluminum content of the III-V compound semiconductor material, such as AlGaN, AlInGaN, AlInGaP or AlGaAs, or the indium content of the III-V compound semiconductor material, such as InGaAs, the bandgap of the III-V compound semiconductor material can be controlled. The larger the aluminum content of the semiconductor material, such as AlGaN, AlInGaN, AlInGaP or AlGaAs, is, or the less the indium content of the semiconductor material, such as InGaAs, is, the larger the bandgaps of these semiconductor materials are. Therefore, by adjusting the composition of the III-V compound semiconductor material, the present invention can form photodetectors suitable for detecting the incident light with various wavelengths, in which the photodetectors are, for example, visible light photodetectors, ultraviolet photodetectors, or infrared photodetectors.

The conductive transparent oxide layer 414 is located on the n-type III-V compound semiconductor layer 412, and the thickness of the conductive transparent oxide layer 414 is equal to $(2m-1)\lambda/4n$, in which m is an integer, n is the refractive index of the conductive transparent oxide layer 414, and $\lambda$ is the cut-off wavelength of the photodetector. A material of the conductive transparent oxide layer 414 can be, for example, ITO, IZO, aluminum-doped zinc oxide (ZnO:Al, AZO), CTO, $CuAlO_2$, LaCuOS, $CuGaO_2$ or $SrCu_2O_2$. The electrode 416 is located on a portion of the conductive transparent oxide layer 414, and the electrode 418 is located on the exposed portion of the n-type III-V compound semiconductor layer 404. The electrode 416 and the electrode 418 can be made of the same metal, such as Cr/Au, Cr/Pt/Au or Ni/Au. In the present embodiment, because the electrode 416 and the electrode 418 are composed of the same metal electrode material, the electrode 416 and the electrode 418 can be formed simultaneously, thereby simplifying the process and correspondingly enhancing the process yield.

When the photodetector is used to detect the incident light 420, the incident light 420 penetrates the photodetector from the n-type III-V compound semiconductor layer 412 toward the undoped III-V compound semiconductor layer 410 and the p-type III-V compound semiconductor layer 408. Because a tunneling layer composed of the $n^{++}$-type III-V compound semiconductor layer 406 with high carrier concentration is formed under a diode structure composed of the n-type III-V compound semiconductor layer 412, the undoped III-V compound semiconductor layer 410 and the p-type III-V compound semiconductor layer 408, in the application of a voltage, a tunneling junction can be formed in the $n^{++}$-type III-V compound semiconductor layer 406. At this time, if the photons of the incident light 420 can be absorbed by the undoped III-V compound semiconductor layer 410 to produce photocurrent, the current will pass through the tunneling junction to keep the diode structure electrically conducting, so as to achieve the purpose of light detection.

A further feature of the present invention is to adjust the locations of the n-type III-V compound semiconductor layer 412 and the p-type III-V compound semiconductor layer 408 in the diode structure to put the n-type III-V compound semiconductor layer 412 above the undoped III-V compound semiconductor layer 410, so that the incident light 420 enters the undoped III-V compound semiconductor layer 410 from the n-type III-V compound semiconductor layer 412. Furthermore, a tunneling layer composed of the $n^{++}$-type III-V compound semiconductor layer 406 with high carrier concentration is formed under the diode structure to form a tunneling junction, which can be passed through by the current to keep the diode structure electrically conducting. Accordingly, the electrode 416 and the electrode 418 can be respectively formed on the n-type III-V compound semiconductor layer 412 and the n-type III-V compound semiconductor layer 404. Because it is much easier to achieve an n-type compound semiconductor material with high carrier concentration than a p-type compound semiconductor material, the electrode 416 and the electrode can respectively have excellent ohmic contact with the n-type III-V compound semiconductor layer 412 and the n-type III-V compound semiconductor layer 404. Therefore, the performance of the photodetector can be effectively enhanced.

According to the aforementioned description, one advantage of the present invention is that the photodetector has a strained layer superlattice structure of high carrier concentration, and the strained layer superlattice structure has a low resistivity, so that the strained layer superlattice structure can have low-resistivity ohmic contact with the electrode, thereby achieving the purpose of enhancing the performance of the photodetector.

According to the aforementioned description, yet another advantage of the present invention is that the strained layer superlattice structure of the photodetector can have superior ohmic contact with the electrode, so that the two electrodes of the photodetector can be made of the same material, thereby lowering the process complexity and achieving the purpose of enhancing the process yield.

According to the aforementioned description, a further advantage of the present invention is that an $n^{++}$-type tunneling layer with high carrier concentration is formed under the n-i-p diode structure, and the $n^{++}$-type tunneling layer can form a tunneling junction to keep the n-i-p diode structure electrically conducting. Therefore, the two electrodes of the photodetector can be formed on the n-type compound semiconductor layers with low resistivity to form good ohmic contact, thereby achieving the purpose of greatly enhancing the performance of the device. Moreover, a flip chip step is employed in the process of the present invention, and the two electrodes can be made of the same material, so the process complexity can be lowered to further enhance the process yield.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A photodetector, comprising:
   a substrate;
   an n-type III-V compound semiconductor layer located on the substrate;
   an undoped III-V compound semiconductor layer located on a first portion of the n-type III-V compound semiconductor layer, and a second portion of the n-type III-V compound semiconductor layer is exposed;
   a p-type III-V compound semiconductor layer located on the undoped III-V compound semiconductor layer;
   a strained layer superlattice structure located on the p-type III-V compound semiconductor layer;
   a transparent conductive layer located on the strained layer superlattice structure;
   a p-type electrode located on a portion of the transparent conductive layer; and
   an n-type electrode located on a portion of the second portion of the n-type III-V compound semiconductor layer.

2. The photodetector according to claim 1, wherein a material of the substrate is selected from the group consisting of sapphire ($Al_2O_3$), GaAs, Si, SiC and ZnO.

3. The photodetector according to claim 1, further comprising a nucleation layer between the substrate and the n-type III-V compound semiconductor layer.

4. The photodetector according to claim 3, wherein a material of the nucleation layer is III-V compound semiconductor.

5. The photodetector according to claim 4, wherein the material of the nucleation layer is selected from the group consisting of GaN, AlGaN, AlInGaN, AlInGaP, AlGaAs and InGaAs.

6. The photodetector according to claim 1, wherein a material of the n-type III-V compound semiconductor layer is selected from the group consisting of n-type doped GaN, AlGaN, AlInGaN, AlInGaP, AlGaAs and InGaAs.

7. The photodetector according to claim 1, wherein a material of the undoped III-V compound semiconductor layer is selected from the group consisting of GaN, $Al_qGa_{1-q}N$, $Al_xIn_yGa_{1-x-y}N$, $Al_sIn_tGa_{1-s-t}P$, $Al_zGa_{1-z}As$ and $In_pGa_{1-p}As$.

8. The photodetector according to claim 1, wherein a material of the P-type III-V compound semiconductor layer is selected from the group consisting of GaN, $Al_qGa_{1-q}N$, $Al_xIn_yGa_{1-x-y}N$, $Al_sIn_tGa_{1-s-t}P$, $Al_zGa_{1-z}As$ or $In_pGa_{1-p}As$.

9. The photodetector according to claim 8, wherein the strained layer superlattice structure is selected from the group consisting of p-type or n-type doped $Al_kGa_{1-k}N/Al_oGa_{1-o}N$ (k>o>q≧0), $Al_aIn_bGa_{1-a-b}N/Al_cIn_dGa_{1-c-d}N$ (a>c>x≧0; b≧0; c≧0), $Al_eIn_fGa_{1-e-f}P/Al_gIn_hGa_{1-g-h}P$ (e>g>s≧0; f≧0; h≧0), $Al_iGa_{1-i}As/Al_jGa_{1-j}As$ (i>j>z≧0) and $In_mGa_{1-m}As/In_nGa_{1-n}As$ (m>n>p≧0), and the bandgap of the material of the strained layer superlattice structure is larger than that of the undoped III-V compound semiconductor layer.

10. The photodetector according to claim 1, wherein the conductive layer is a semi-transparent metal layer.

11. The photodetector according to claim 1, wherein the conductive layer is composed of Ni/Au.

12. The photodetector according to claim 1, wherein the transparent conductive layer is a conductive transparent oxide layer, a material of the conductive transparent oxide layer is selected from the group consisting of ITO, IZO, aluminum-doped zinc oxide (ZnO:Al, AZO), CTO, $CuAlO_2$, LaCuOS, $CuGaO_2$ and $SrCu_2O_2$, and the thickness of the conductive transparent oxide layer is equal to $(2m-1)\lambda/4n$, in which m is an integer, n is the refractive index of the conductive transparent oxide layer, and $\lambda$ is the cut-off wavelength of the photodetector.

13. The photodetector according to claim 1, wherein the p-type electrode and the n-type electrode are selected from the group consisting of Cr/Au and Cr/Pt/Au.

14. The photodetector according to claim 1, wherein the photodetector is selected from the group consisting of a visible light photodetector, an ultraviolet light photodetector and an infrared light photodetector.

15. A photodetector, comprising:
a substrate;
a first n-type III-V compound semiconductor layer located on the substrate;
an $n^{++}$-type III-V compound semiconductor layer located on a first portion of the first n-type III-V compound semiconductor layer, and a second portion of the first n-type III-V compound semiconductor layer is exposed;
a p-type III-V compound semiconductor layer located on the $n^{++}$-type compound semiconductor layer;
an undoped III-V compound semiconductor layer located on the p-type III-V compound semiconductor layer;
a second n-type III-V compound semiconductor layer located on the undoped III-V compound semiconductor layer;
a conductive transparent oxide layer located on the second n-type III-V compound semiconductor layer;
a first electrode located on a portion of the conductive transparent oxide layer; and
a second electrode located on a portion of the second portion of the first n-type III-V compound semiconductor layer.

16. The photodetector according to claim 15, wherein a material of the substrate is selected from the group consisting of sapphire, GaAs, Si, SiC and ZnO.

17. The photodetector according to claim 15, further comprising a nucleation layer between the substrate and the first n-type III-V compound semiconductor layer.

18. The photodetector according to claim 17, wherein a material of the nucleation layer is III-V compound semiconductor, and the material of the nucleation layer is selected from the group consisting of GaN, AlGaN, AlInGaN, AlInGaP, AlGaAs and InGaAs.

19. The photodetector according to claim 15, wherein a material of the first n-type III-V compound semiconductor layer is selected from the group consisting of GaN, AlGaN, AlInGaN, AlInGaP, AlGaAs and InGaAs.

20. The photodetector according to claim 15, wherein the first n-type III-V compound semiconductor layer is composed of an n-type heavily doped material.

21. The photodetector according to claim 15, wherein the $n^{++}$-type III-V compound semiconductor layer is composed of a strained layer superlattice structure, and the structure of the $n^{++}$-type III-V compound semiconductor layer is selected from the group consisting of $Al_aGa_{1-a}N/Al_bGa_{1-b}N$ (a>b≧0), $Al_cIn_dGa_{1-c-d}N/Al_eIn_fGa_{1-e-f}N$ (c>e≧0; d≧0; f≧0), $Al_gIn_hGa_{1-g-h}P/Al_iIn_jGa_{1-i-j}P$ (g>i≧0; h≧0; j≧0), $Al_kGa_{1-k}As/Al_mGa_{1-m}As$ (k>m≧0), and $In_oGa_{l-o}As/In_pGa_{1-p}As$ (o>p≧0).

22. The photodetector according to claim 15, wherein a material of the $n^{++}$-type III-V compound semiconductor layer is selected from the group consisting of GaN, $Al_aGa_{1-a}N$, $Al_cIn_dGa_{1-c-d}N$, $Al_gIn_hGa_{1-g-h}P$, $Al_kGa_{1-k}As$ and $In_oGa_{1-o}As$.

23. The photodetector according to claim 15, wherein a material of the p-type III-V compound semiconductor layer is selected from the group consisting of GaN, AlGaN, AlInGaN, AlInGaP, AlGaAs and InGaAs.

24. The photodetector according to claim 15, wherein a material of the undoped III-V compound semiconductor layer is selected from the group consisting of $Al_aGa_{1-a}N$, $Al_bIn_cGa_{1-b-c}N$, $Al_dIn_eGa_{1-d-e}P$, $Al_fGa_{1-f}As$ and $In_gGa_{1-g}As$.

25. The photodetector according to claim 24, wherein a material of the second n-type III-V compound semiconductor layer is selected from the group consisting of $Al_hGa_{1-h}N$ (h>a≧0), $Al_iIn_jGa_{1-i-j}N$ (i>b≧0; j≧0), $Al_kIn_mGa_{1-k-m}P$ (k>d≧0; m≧0), $Al_nGa_{1-n}As$ (n>f≧0) and $In_oGa_{1-o}As$ (o>g≧0).

26. The photodetector according to claim 24, wherein the second n-type III-V compound semiconductor layer is composed of an n-type strained layer superlattice structure, and the n-type strained layer superlattice structure is selected from the group consisting of $Al_hGa_{1-h}N/Al_pGa_{1-p}N$ (h>p>a≧0), $Al_iIn_jGa_{1-i-j}N/Al_qIn_rGa_{1-q-r}N$ (i>q>b≧0; j≧0; r≧0), $Al_kIn_mGa_{1-k-m}P/Al_sIn_tGa_{1-s-t}P$ (k>s>d≧0; m≧0; t≧0), $Al_nGa_{1-n}As/Al_uGa_{1-u}As$ (n>u>f≧0), and $In_oGa_{1-o}As/In_vGa_{1-v}As$ (o>v>g≧0).

27. The photodetector according to claim 15, wherein the thickness of the conductive transparent oxide layer is equal to $(2m-1)\lambda/4n$, in which m is an integer, n is the refractive index of the conductive transparent oxide layer, and λ is the cut-off wavelength of the photodetector, and a material of the conductive transparent oxide layer is selected from the group consisting of ITO, IZO, aluminum-doped zinc oxide (ZnO:Al, AZO), CTO, $CuAlO_2$, LaCuOS, $CuGaO_2$ and $SrCu_2O_2$.

28. The photodetector according to claim 15, wherein a material of the first electrode and a material of the second electrode are selected from the group consisting of Cr/Au, Cr/Pt/Au and Ni/Au.

29. The photodetector according to claim 15, wherein a doping concentration of the $n^{++}$-type III-V compound semiconductor layer is greater than $10^{19}/cm^3$.

30. The photodetector according to claim 15, wherein a doping concentration of the second n-type III-V compound semiconductor layer is greater than $10^{18}/cm^3$.

31. The photodetector according to claim 15, wherein the photodetector is selected from the group consisting of a visible light photodetector, an ultraviolet light photodetector and an infrared light photodetector.

* * * * *